United States Patent

Murata

(10) Patent No.: US 7,819,716 B2
(45) Date of Patent: Oct. 26, 2010

(54) ORGANIC ELECTROLUMINESCENT ELEMENT AND THE MANUFACTURING METHOD

(75) Inventor: Koji Murata, Tokyo (JP)

(73) Assignee: Toppan Printing Co., Ltd. (JP)

( * ) Notice: Subject to any disclaimer, the term of this patent is extended or adjusted under 35 U.S.C. 154(b) by 342 days.

(21) Appl. No.: 11/544,158

(22) Filed: Oct. 6, 2006

(65) Prior Publication Data

US 2007/0190236 A1     Aug. 16, 2007

(30) Foreign Application Priority Data

Feb. 15, 2006     (JP)     .............................. 2006-038247

(51) Int. Cl.
*H01J 9/24*     (2006.01)
*H01L 51/56*    (2006.01)

(52) U.S. Cl. ......................................... 445/23; 313/506

(58) Field of Classification Search ......... 313/498–512; 428/690–691; 445/23

See application file for complete search history.

(56) References Cited

U.S. PATENT DOCUMENTS

| | | | | |
|---|---|---|---|---|
| 6,420,200 | B1 * | 7/2002 | Yamazaki et al. | 438/30 |
| 6,582,504 | B1 | 6/2003 | Fujita | |
| 2003/0193057 | A1 * | 10/2003 | Humbs et al. | 257/88 |
| 2004/0021413 | A1 | 2/2004 | Ito et al. | |
| 2004/0038138 | A1 * | 2/2004 | Kiguchi et al. | 430/7 |
| 2004/0160154 | A1 * | 8/2004 | Nishimura et al. | 313/113 |
| 2004/0160644 | A1 * | 8/2004 | Samworth | 358/3.09 |
| 2005/0012450 | A1 * | 1/2005 | Shinohara et al. | 313/504 |
| 2005/0118328 | A1 * | 6/2005 | Seki et al. | 427/66 |
| 2005/0196969 | A1 * | 9/2005 | Gunner et al. | 438/725 |
| 2006/0046094 | A1 * | 3/2006 | Nishino et al. | 428/690 |
| 2006/0098485 | A1 * | 5/2006 | Leenders et al. | 365/185.12 |
| 2006/0207457 | A1 * | 9/2006 | Rogojevic et al. | 101/454 |

FOREIGN PATENT DOCUMENTS

| | | |
|---|---|---|
| JP | 05-078655 | 3/1993 |
| JP | 10-012377 | 1/1998 |
| JP | 10-077467 | 3/1998 |
| JP | 11-024604 | 1/1999 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-305077 | 10/2002 |
| JP | 2002-313561 | 10/2002 |
| JP | 2003-059654 | 2/2003 |
| JP | 2003-059656 | 2/2003 |

(Continued)

*Primary Examiner*—Toan Ton
*Assistant Examiner*—Zachary Snyder
(74) *Attorney, Agent, or Firm*—Squire, Sanders & Dempsey L.L.P.

(57) ABSTRACT

A manufacturing method of an organic electroluminescent element is provided. The method includes forming an insulator layer between pattern-formed pixel electrodes on a substrate, and forming a hole transport layer by printing hole transport ink, having a hole transport material dissolved in a solvent, on the pixel electrodes between the insulator layers by relief printing, wherein the hole transport ink includes 3,4-polyethylen dihydroxy thiophen (PEDOT), and monohydric alcohol and dihydric alcohol as solvents.

4 Claims, 3 Drawing Sheets

FOREIGN PATENT DOCUMENTS

| | | |
|---|---|---|
| JP | 2003-243163 | 8/2003 |
| JP | 2003-282244 | 10/2003 |
| JP | 2004-055333 | 2/2004 |
| JP | 2004-063359 | 2/2004 |
| JP | 2004-355913 | 12/2004 |
| WO | WO 99/10862 | 4/1999 |

* cited by examiner

|   | Pattern configuration of a hole transport layer | occurrence of leakage current | Emitting state (Unevenness) |
|---|---|---|---|
| EXAMPLE 1 | ○ | ○ | ○ |
| EXAMPLE 2 | ○ | ○ | ○ |
| Comparative Example 1 | ×(Failure of transfer) | ○ | × |
| Comparative Example 2 | ×(Separation of component) | × | × |
| Comparative Example 3 | ○ | ○ | × |

FIG.3

ORGANIC ELECTROLUMINESCENT ELEMENT AND THE MANUFACTURING METHOD

CROSS REFERENCE

This application claims priority to Japanese application number 2006-038247, filed on Feb. 15, 2006, which is incorporated by reference.

BACKGROUND OF THE INVENTION

1. Field of the Invention

The present invention relates to an organic electroluminescent element and the manufacturing method, wherein the organic electroluminescent element includes a polymer organic luminescent layer and wherein the organic electroluminescent element is used for an organic electroluminescent display panel and the like. More particularly, the present invention relates to an organic electroluminescent element of which an organic luminescent layer is formed by a printing method. In addition, the present invention relates to a method of making an organic electroluminescent element which has a high grade of display without any or significant amount of unevenness and defect.

2. Description of the Related Art

An organic electroluminescent element has an organic luminous layer comprising an organic luminescent material between two opposing electrodes. By means of applying electric current to the organic luminous layer between both electrodes, the organic luminous layer emits light. Organic luminescent layer thickness is important so that the organic luminous layer emits light efficiently. So, organic luminescent layer thickness has to be about 100 nm.

Low molecular materials and polymeric materials are examples of organic luminescent materials that can be used to form the organic luminous layer. Generally, as for low molecular materials, thin film can be formed by vacuum evaporation. A mask with minute patterns is used at this time, and patterns are formed. In a manufacturing method with the use of vacuum processing such as vacuum evaporation, upsizing of a substrate can diminish the accuracy of the patterning. In addition, throughput is poor because a layer is formed in vacuum.

Thus the following method has been tried recently. Polymer organic luminescent material is dissolved in a solvent, and ink is made. This ink is used, and thin film is formed by a wet coating method.

A layer structure of an organic luminescent medium layer when an organic luminescent medium layer including an organic luminescent layer is formed by wet coating using a coating solution of high polymer materials is described below. The two-layer construction where a hole transport layer and an organic luminescent layer are laminated on an anode side is generally used. As for the organic luminescent layer, it is necessary for the organic luminescent inks including organic luminescent materials of red (R) green (G) and blue (B) in a solvent to be applied independently in order to form a color panel. (Japanese Patent Laid-Open No. 2001-93668 Official Gazette)

On the other hand, a hole transport layer is generally applied on a whole area contributing to imaging of an organic electroluminescent display panel without patterning the hole transport layer. A hole transport layer is formed by coating methods such as a spin coat method and a die coat method. Generally a hole transport layer is a thin film having a thickness equal to or less than 100 nm. Therefore, an electric current can flow more easily in a depthwise direction of a hole transport layer than a transverse direction of a hole transport layer. Therefore, it is said that leakage current to the outside of a picture element is insignificant if patterning of electrode is performed.

On the other hand, the present inventors manufactured an organic electroluminescent element of passive matrix type as follows. The pattern-formed pixel electrodes which are anodes were formed on a glass substrate. A pattern-formed insulator layer was formed between pixel electrodes. A hole transport layer was entirely applied in a significant surface of an organic electroluminescent element. A pattern-formed organic luminescent layer was formed. A pattern-formed cathode layer was formed. In this organic electroluminescent element of passive matrix type, current flowing between pattern-formed electrodes leaked out. Therefore luminous efficiency fell. In addition, contrast was lowered. Thus, it is necessary to form a pattern-formed hole transport layer only on pixel electrodes. In addition, it is necessary not to form a hole transport layer on an insulator layer.

However, a hole transport material forming a hole transport layer consists of a polymer material such as (3,4-polyethylen dihydroxy thiophen) (PEDOT). Hole transport ink is made by dissolving this hole transport material in a solvent. In consideration of solubility of a polymer material and necessity of thin film formation, it is necessary for the concentration of hole transport ink to be low. For example, the concentration is around 2%. And partition walls are necessary to prevent ink from spreading when the low-viscosity hole transport ink of which concentration is around 2% is printed in the shape of the pattern. A high insulator layer should be formed between pixel electrodes, and it should be used as a partition wall. Hole transport ink is applied on pixel electrodes sectioned by an insulator layer. In this case, a printing process such as an ink jet method or relief printing can be used. In addition, photogravure process is unsuitable to print on the substrate which is not flat.

An ink jet method is the method how organic luminescent ink is discharged multiple times on a substrate from ink jet nozzles. A discharge jet is separated from a substrate. Therefore, the ink spreads only by its own weight between partition walls on a substrate. Thus, it is difficult to apply ink to a whole area surrounded by an insulator layer by an ink jet method. Especially, print omission is easy to occur in edges of the pixel electrodes.

On the other hand, a method of avoiding print omission in an ink jet method is designed. However it is necessary to apply ink sufficiently to an aperture to prevent print omission. In this case, it is necessary to prevent ink from overflowing a partition wall. Therefore, it is necessary to do water-repellent processing for a partition wall. Then the number of the processes increases. Even more particularly, as for the ink applied between water repellent partition walls, it is in heaping full condition. Therefore, film thickness uniformity in a picture element becomes bad. Therefore, there is a problem in an aspect of homogeneity and stability of a display panel.

On the other hand, projection parts of a relief printing plate push a substrate in relief printing. In addition, a relief printing plate is buried in space surrounded by partition walls. Therefore, the ink is expanded in a picture element surrounded with partition walls. Thus, print omission in edges of pixel electrodes is hard to occur. In addition, relief printing method is simple and easy, and throughput is good as compared to ink jet method. Thus, when a hole transport layer is formed using hole transport ink, relief printing is preferred. However, when a good organic electroluminescent display unit is made by forming a uniform hole transport layer without defect and unevenness by relief printing, appropriate conditions of application of ink change according to a kind of printed pattern. Therefore specifying printing condition is necessary every time when a printed pattern changes.

SUMMARY OF THE INVENTION

In an organic electroluminescent element of an embodiment of the present invention, degradation of luminous efficiency due to leakage current does not occur or occurs very insignificantly. In addition, embodiments of the present invention provide excellent uniformity. In some embodiments, unevenness and defects are completely eliminated. In some embodiments, unevenness and defects are significantly reduced as compared to what is disclosed in the art. Display quality is good. A manufacturing method of an organic electroluminescent element is provided, the method includes forming a insulator layer between pattern-formed pixel electrodes on a substrate, and forming a hole transport layer by printing hole transport ink, having a hole transport material dissolved in a solvent, on the pixel electrodes between the insulator layers by relief printing, wherein the hole transport ink includes 3,4-polyethylen dihydroxy thiophen (PEDOT), and monohydric alcohol and dihydric alcohol as solvents.

BRIEF DESCRIPTION OF DRAWINGS

FIG. 3 is an estimation result of an organic electroluminescent display panel of examples and comparative examples.

In these drawings, 1 is a substrate; 2 is a pixel electrode; 3 is an insulator layer; 4 is a hole transport layer; 5 is an organic luminescent layer; 6 is a cathode layer; 7 is a glass cap; 8 is an adhesive; 10 is an ink tank; 12 is an ink chamber; 14 is an anilox roll; 14a is an ink layer; 16 is a printing plate; 18 is a printing cylinder; 20 is a flat base; and 24 is a substrate.

DESCRIPTION OF THE PREFERRED EMBODIMENTS

An embodiment of an organic electroluminescent display panel of passive matrix type is explained below.

For driving type of an organic electroluminescent element, passive matrix type and active matrix type are exemplified. An organic electroluminescent element of the present invention can be applied to both organic electroluminescent element of a passive matrix type and an organic electroluminescent element of an active matrix type.

An organic electroluminescent element of a passive matrix type is an organic electroluminescent element which includes stripe-shaped electrodes that are opposed to in a perpendicular state. It emits light at the intersection point. On the other hand, an active matrix type has a so-called thin film transistor (TFT) substrate. Transistor is formed in each pixel. In active matrix type, light is independently emitted in each pixel.

Figure 1:
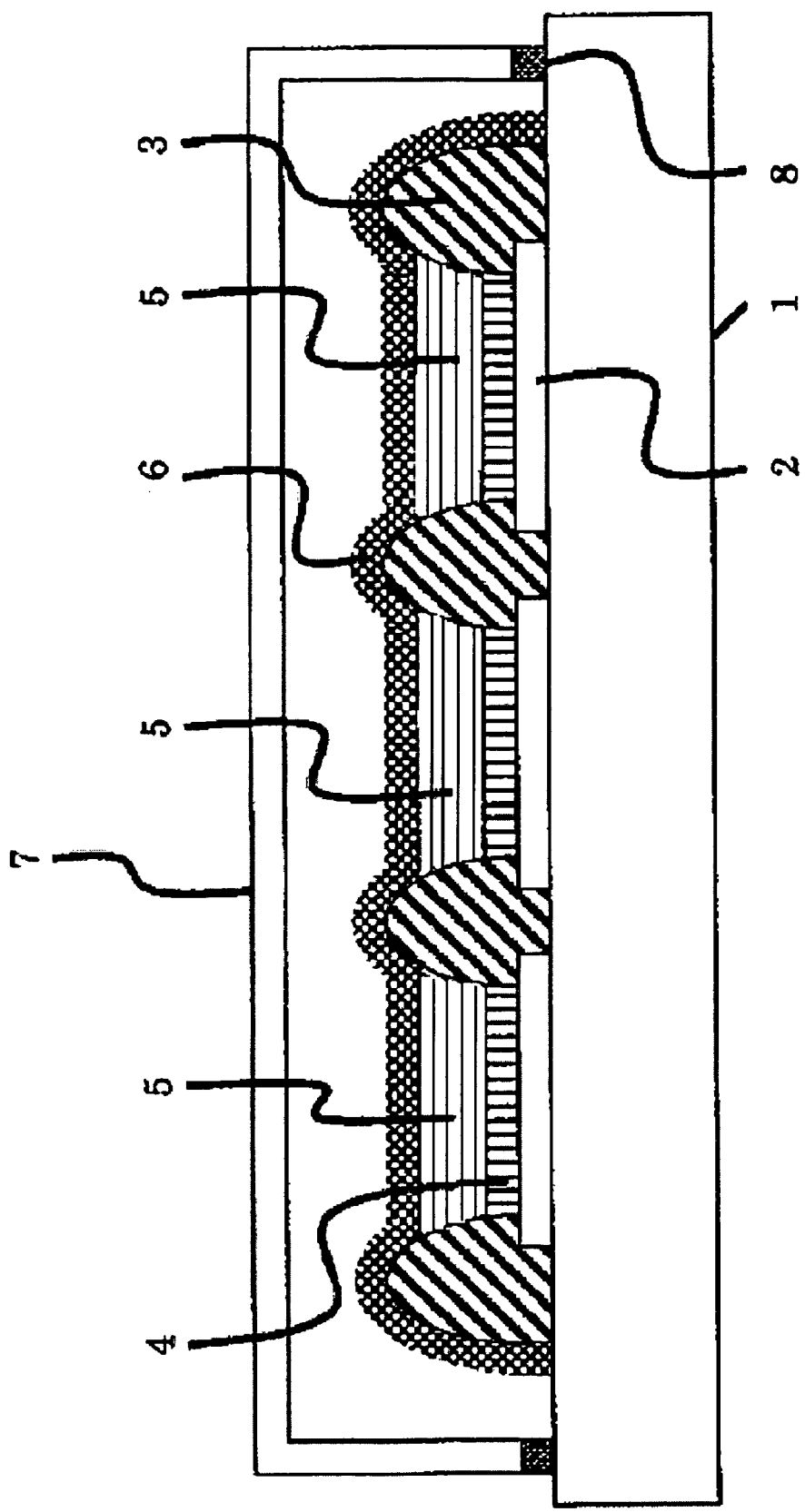
FIG. 1 is a schematic view which shows structure of an organic electroluminescent panel including an organic electroluminescent element of an embodiment of the present invention.

FIG. 1 is a structural sectional drawing of an organic electroluminescent display panel of an embodiment of the present invention.

An organic electroluminescent element in this organic electroluminescent display panel is formed on a substrate. In the case of an organic electroluminescent element of a bottom emission method, it is necessary for a substrate to be transparent. However, in the case of a top emission method, a substrate does not need to be transparent. In addition, for a substrate 1, a glass substrate and a plastic film or sheet can be used. If a plastic film is used, a macromolecular electroluminescent device can be manufactured by take-up. In other words an inexpensive display panel can be manufactured. In addition, for the plastic, polyethylene terephthalate, polypropylene, cyclo-olefin polymers, a polyamide, polyethersulfone, polymethyl methacrylate and polycarbonate can be used. In addition, steam or oxygen barrier layer comprising metallic oxide such as silicon oxide, metal nitrides such as silicon nitrides and polyvinylidene chloride, polyvinyl chloride, saponified ethylene-vinyl acetate copolymer can be formed on these films if necessary.

In addition, pattern-formed pixel electrodes 2 are formed on a substrate 1 as anodes. For materials of pixel electrodes 2, transparent electrode materials such as ITO (indium tin complex oxide), IZO (indium zinc complex oxide), tin oxide, zinc oxide, indium oxide and aluminium oxide complex oxide can be used.

In addition, electrical resistance of ITO is low. ITO has solvent resistance. ITO is transparent. Therefore, ITO is preferable.

ITO is formed on a substrate by sputter method. Patterning of ITO is performed by photolithography method. ITO becomes line-shaped pixel electrodes 2 in this way.

An insulator layer 3 is formed between adjacent pixel electrodes by photolithography method using a photosensitive material.

As for the thickness of insulator layer 3, it is desirable to be 0.5 μm-5.0 μm. When an insulator layer is formed between adjacent pixel electrodes, spreading of hole transport ink printed on each pixel electrodes can be controlled. In addition, when a display unit is made, there is no hole transport layer on an insulator layer. Therefore, leakage current can be prevented.

When an insulator layer is too low, spreading of ink cannot be prevented. Therefore, a hole transport layer is formed on an insulator layer.

In addition, in an organic electroluminescent display panel of passive matrix type, when an insulator layer is formed between pixel electrodes, the cathode layer which is perpendicular to an insulator layer is formed. For this case, a cathode layer is broken when an insulator layers is too high. Therefore, display fault occurs. When height of an insulator layer exceeds 5.0 μm, a cathode is easy to be broken.

In addition, as a photosensitive material forming an insulator layer, both positive type resist and negative type resist are preferable. When partition walls do not have enough insulating properties, an electric current flows between adjacent pixel electrodes through partition walls, and display fault occurs. For the photosensitive materials, a polyimide system, an acryl resin system, a novolac resin system and a fluorene system can be used, but they are not limited to these material.

In addition, materials having light shielding properties may be incorporated into a photosensitive material for the purpose of improving display quality of an organic electroluminescent element.

In addition, a light-sensitive resin forming an insulator layer 3 is applied by an application machine such as a spin coater, a bar coating machine, a roll coater, a die coating machine, an engraved-roll coater. And patterning of a light-sensitive resin is performed by photolithography method. In addition, photogravure offset printing, relief reversal offset printing and flexography may be used to form an insulator layer without the use of a light-sensitive resin.

After having formed an insulator layer 3, a hole transport layer 4 is formed. In this embodiment, as hole transport material forming a hole transport layer 4, poly (3,4-ethylenedioxy thiophen) (PEDOT) is used. Hole transport material ink is prepared by dissolving this material in solvent. And relief printing method in the present invention can use this hole transport material ink. In addition, it is desirable that volume resistivity of a formed hole transport layer is lower than $1 \times 10^6$ $\Omega$/cm from the viewpoint of luminous efficiency.

In addition, for solvents dissolving a hole transport material, mixed solvents comprising solvents such as toluene, xylene, acetone, methyl ethyl ketone, methyl isobutyl ketone, cyclohexanone, methanol, ethanol, isopropanol, ethylene glycol, propylene glycol, polyethylene glycol, glycerine, ethyl acetate, butyl acetate, isopropyl acetate and water can be used. According to the present invention, a mixed solvent including monohydric alcohol and dihydric alcohol is preferable.

Monohydric alcohol lowers surface tension of hole transport ink. And wettability of a substrate improves. In other words monohydric alcohol is essential to apply ink to a substrate adequately. It is important that hole transport ink keeps its stability in order to obtain above-mentioned effect. Especially, even if methanol, ethanol and isopropanol are added in a PEDOT water solution, hole transport ink is hard to become unstable. Therefore, methanol, ethanol and isopropanol are preferable.

Only one kind of monohydric alcohol may be used. Mixed plural kinds of monohydric alcohols may be used.

In addition, as monohydric alcohol, 2-methoxyethanol, 2-ethoxy-ethanol, 2-butoxyethanol and 1-propanol can be used.

On the other hand, dihydric alcohol can retard drying of the ink. Dihydric alcohol should be added to ink to improve leveling characteristics. Especially ethylene glycol and propylene glycol are preferable.

Dry speed of hole transport ink is fast when only monohydric alcohol is added to hole transport ink. For this case, ink dries on relief printing plate. Therefore, hole transport ink cannot be applied to a substrate. Thus addition of dihydric alcohol is essential for good quality printing. Only one kind of dihydric alcohol may be used. Mixed plural kinds of dihydric alcohol may be used.

The reason why both monohydric alcohol and dihydric alcohol are necessary is described below.

When only monohydric alcohol is used, an evaporation rate of hole transport layer ink is too fast. Therefore, it's hard to print. Therefore, it is unfavorable.

In addition, when only dihydric alcohol is used, surface tension of hole transport ink cannot be lowered sufficiently. Therefore, wettability of hole transport ink to a substrate becomes insufficient. Therefore, repellency and unevenness of ink occur.

Thus it is desirable that monohydric alcohol and dihydric alcohol are adequately included in hole transport ink.

In other words it is desirable for a total weight fraction of monohydric alcohol and dihydric alcohol in hole transport ink to be 5%-50%. When alcohol is more than 50%, hole transport ink including PEDOT may become unstable.

For this case, the ratio of monohydric alcohol to dihydric alcohol should be set not to lose stability of hole transport ink. In addition, the ratio of monohydric alcohol to dihydric alcohol should be set in accordance with a printing condition.

In addition, when alcohol is under 5%, it's hard to print due to insufficient surface tension of hole transport ink.

In addition, it is preferable for boiling point of monohydric alcohol and dihydric alcohol to be equal to or less than 200 degrees Celsius at atmospheric pressure respectively. When boiling point is more than 200 degrees Celsius, solvent does not volatilize well at the time of baking in hole transport layer formation. Therefore, residual solvent increases and stability of a hole transport layer may worsen. In addition, burning at 200 degrees Celsius or higher to completely vaporize the solvent is unfavorable because deterioration of a hole transport layer by heat increases.

In addition, a surface active agent, an antioxidant, a viscosity modifier, an ultraviolet absorber may be added to hole transport ink if necessary.

In addition, compatibility between a plastic plate and hole transport ink is necessary to obtain a good pattern without unevenness and defect for whole area. In other words it is desirable that contact angle between hole transport ink and a plastic plate face is less than 45 degrees and more than 15 degrees. When a contact angle is under 15 degrees, wettability in a plate face may be too high. Therefore, the ink layer applied on projection parts of a plastic plate flows out in concave portions of a plastic plate. Therefore, good patterns are not obtained.

In addition, ink is not transferred to projection parts of a plastic plate from an anilox roll when a contact angle is greater than 45 degrees. In addition, even if ink is transferred to a relief printing plate, ink does not level well on a relief printing plate. So, moire due to line of an anilox roll occurs on a substrate after ink is transferred on the substrate. Therefore, it is unfavorable.

It is important to select an appropriate constitution of hole transport layer ink according to a kind of a plastic plate.

Figure 2:
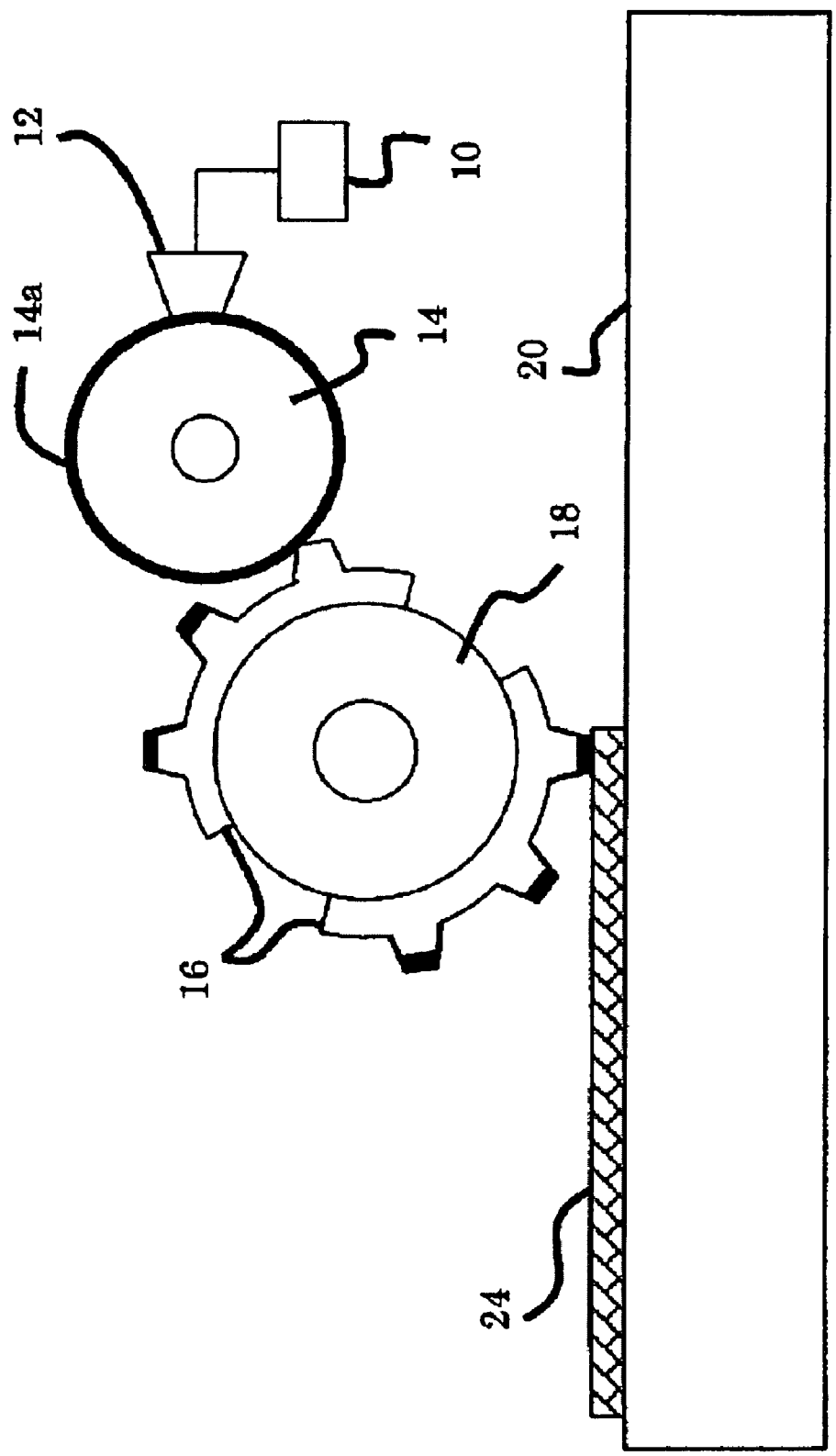
FIG. 2 is a schematic diagram of a relief printing apparatus used in the present invention.

FIG. 2 shows a schematic diagram of a relief printing apparatus which pattern-prints hole transport ink comprising hole transport material on a substrate on which pixel electrodes and an insulator layer are formed.

This relief printing device has an ink tank 10, an ink chamber 12, an anilox roll 14 and a plate cylinder 18 on which a plastic relief printing plate 16 is equipped. Hole transport ink is taken to an ink tank 10. Hole transport ink is sent into an ink chamber 12 from an ink tank 10. An anilox roll 14 makes contact with an ink feed section of an ink chamber 12, and it is rotatably supported.

And, according to rotation of an anilox roll 14, ink layer 14a comprising hole transport ink supplied on an anilox roll face becomes uniform. This ink layer transfers on projection parts of a plate 16 mounted on a printing cylinder 18 which is rotationally driven in proximity to an anilox roll. A substrate 24 on which transparent electrodes and an insulator layer are formed is transported to a printing position of a flat base 20 by the transporting means that are not illustrated. And ink on projection parts of a plate 16 is printed on a substrate 24. And ink is dried if necessary. A hole transport layer is formed on a substrate in this way.

In addition, an embodiment of a relief printing plate is a water-developable light-sensitive resin relief printing plate.

For photosensitive resin plates, there are solvent developing type and water developing type. In the case of solvent developing type photosensitive resin plate, an organic solvent is used as a liquid developer of an exposed resin plate. In the case of water-developable photosensitive resin plate, water is used as a liquid developer for an exposed resin plate. A solvent developing type photosensitive resin plate shows resistance to water type ink. A water-developable photosensitive resin plate shows resistance to organic solvent system ink. In the present invention, all photosensitive resin plate having resistance to hole transport ink can be used.

After having formed a hole transport layer 4, an organic luminescent layer is formed. An organic luminescent layer is a layer emitting light by an electric current. For organic luminescent materials forming organic luminescent layers, the materials which scattered a luminous pigment such as coumarin system, perylene system, a pyran system, anthrone system, PORUFIREN system, quinacridon system, N,N'-dialkyl permutation quinacridon system, naphthalimido system, N,N'-diaryl permutation pyrrolo pyrrole series and iridium complex system in macromolecules such as polystyrene, polymethyl methacrylate and polyvinyl carbazole can be used.

In addition, high polymer materials such as poly arylene system, PAV [polyarylenevinylene] system or a poly fluorene system can be used.

Organic luminescent ink is prepared by dissolving these organic luminescent materials in a solvent.

For a solvent dissolving an organic luminescent material, toluene, xylene, acetone, anisole, methyl ethyl ketone, methyl isobutyl ketone and cyclohexanone can be used. The above mentioned solvent may be used alone. In addition, the above mentioned solvent may be used as mixed solvent.

Above all, aromatic organic solvent such as toluene, xylene and anisole is preferred from an aspect of solubility of an organic luminescent material.

In addition, a surface active agent, an antioxidant, a viscosity modifier, an ultraviolet absorber may be added to an organic luminescent ink if necessary.

In addition, for formation method of an organic luminescent layer pattern, relief printing can be used. In addition, ink jet process, intaglio offset printing and relief reversal offset printing can be used, too. In addition, when an organic luminescent layer is formed by relief printing, a plastic plate suitable to an organic luminescent ink can be used. Above all, a water-developable light-sensitive resin relief printing plate is preferred.

Relief printing method is described as using a relief printing plate in the broad sense. Relief printing method of the present invention is a printing method which uses a relief printing plate comprising a rubber printing plate or a resin printing plate. In addition, a printing method which uses a rubber relief printing plate is referred to as flexography in the printing industry. In addition, a printing method which uses a plastic plate is referred to as the plastic plate printing method. However, printing methods of both are referred to as relief printing method in the present invention.

As for the rubber plate and the resin plate used in relief printing, photosensitive rubber plate and resin plate are employed mainly now. On the other hand, materials of relief printing plate are multiplied. Difference of photosensitive rubber plate and photosensitive resin plate are uncertain. Therefore, in present specification, both are referred to as light-sensitive resin relief printing plate.

After having formed organic luminescent layer 5, a line pattern cathode layer 6 which is perpendicular to line pattern pixel electrodes is formed. For a material of a cathode layer 6, the material which is suitable for luminescent property of an organic luminescent layer can be used. For example, metal simple substance such as lithium, magnesium, calcium, ytterbium and aluminium can be used. An alloy of the above mentioned metal simple substance and the stable metal such as gold and silver can be used. In addition, conductive oxidate such as indium, zinc and tin can be used. For formation method of a cathode layer, a vacuum evaporation method using a mask can be used.

In addition, in the case of an organic electroluminescence element of the above mentioned embodiment, there are a hole transport layer and an organic luminescent layer between the pixel electrode which is an anode and a cathode layer. In addition, there may be a hole blocking layer, an electron transport layer, an electron injection layer between an anode and a cathode layer if necessary.

In addition, layer formation method shown in present specification can be used when the above mentioned layer is formed.

Finally an organic electroluminescent element is sealed using glass cap 7 and adhesive 8 to protect the organic electroluminescent element from outside oxygen and moisture. An organic electroluminescent display panel can be obtained in this way.

In addition, in the case of an organic electroluminescent element having a flexible substrate, the organic electroluminescent element may be sealed using a sealing compound and a flexible film.

According to the manufacturing method of an organic electroluminescent element of the present invention, a hole transport layer is applied to a whole area of electrode partitioned off by an insulator layer. And a hole transport layer is not formed on an insulator layer. As a result, luminous efficiency does not fall because leakage current in a hole transport layer does not occur. An organic electroluminescent element of which display quality is good without unevenness and defect, or with minimal unevenness and defect can be obtained.

EXAMPLE 1

ITO thin film was formed by sputter method on a glass substrate of which diagonal was 1.8 inches. Patterning of ITO thin film was performed by photolithography method and etching using an acid solution. Pixel electrodes were formed in this way.

Line pattern of pixel electrodes is described below. Line width was 136 μm. Space width was 30 μm. There was 192 lines on a glass substrate of 32 mm square.

Next an insulator layer was formed as follows. Acrylic photoresist material was applied to a whole area of a glass substrate having pixel electrodes by a spin coat.

A condition of a spin coat is described below.

A rotation of 150 rpm for five seconds. Next a rotation of 500 rpm for 20 seconds.

By this spin coat, an insulator layer of which height was 1.5 μm was formed.

Patterning of photoresist material applied on a whole area was performed by photo-lithography method. In this way, a line pattern-shaped insulator layer was formed between pixel electrodes.

Hole transport ink comprising the following material was made.

BAYTRON (R) AI-4083 which was PEDOT solution: 80 weight percent.

Isopropanol: 15 weight percent.

Ethylene glycol: 5 weight percent.

The viscosity of this PEDOT solution was 12 mPa·s. In this case, the contact angle between the relief printing plate face and hole transport ink were 25 degrees.

A hole transport layer was formed between insulator layers by relief printing using the above mentioned ink and the relief printing plate. An anilox roll of 180 line/inch was used in printing.

After printing, ink was dried in atmospheric air at 200 degrees Celsius for 30 minutes. A hole transport layer was formed in this way. The hole transport layer thickness was 50 nm.

Patterning condition of the hole transport layer was checked.

The following organic luminescent ink was prepared. The polyphenylene vinylene derivative which was an organic luminescent material dissolved in toluene. The concentration of a polyphenylene vinylene derivative was 1%.

This organic luminescent ink was printed on line-shaped pixel electrodes between insulator layers by relief printing.

An organic luminescent layer was formed in this way.

For this case, an anilox roll of 150 line/inch and a water-developable photosensitive resin plate were used.

The organic luminescent layer thickness after printing and drying of organic luminescent ink was 80 nm.

Thereupon, a line-shaped cathode layer comprising Ca and Al were formed by resistance heating evaporation method using a mask to be perpendicular to line-shaped pixel electrodes.

Finally this organic electroluminescent element was sealed using a glass cap and adhesive to be protected from outside oxygen and moisture.

An organic electroluminescent display panel was made in this way.

There were taking-out electrodes of an anode side connected to each pixel electrodes and taking-out electrodes of cathode side in a penumbra of displaying part of an obtained organic electroluminescent display panel.

These taking-out electrodes were connected to a power source. Then, emitting state of this organic electroluminescent display panel was checked.

EXAMPLE 2

Hole transport ink comprising the following materials was prepared.
BAYTRON AI-4083: 60 weight percent.
Ethanol: 10 weight percent.
Ethylene glycol: 30 weight percent.
An organic electroluminescent display panel was made same as example 1 other than hole transport ink.

COMPARATIVE EXAMPLE 1

Hole transport ink comprising the following materials was prepared.
BAYTRONM AI-4083: 70 weight percent.
Methanol: 30 weight percent.
An organic electroluminescent display panel was made same as example 1 other than hole transport ink.

COMPARATIVE EXAMPLE 2

Hole transport ink comprising the following materials was prepared.
BAYTRON AI-4083: 40 weight percent.
Isopropanol: 30 weight percent.
Ethylene glycol: 30 weight percent.
An organic electroluminesceht display panel was made same as example 1 other than hole transport ink.

COMPARATIVE EXAMPLE 3

Hole transport ink comprising the following materials was prepared.
BAYTRON AI-4083: 70 weight percent.
Isopropanol: 20 weight percent.
Glycerine: 10 weight percent.
An organic electroluminescent display panel was made same as example 1 other than hole transport ink.

An estimation result of line pattern configuration of a hole transport layer and an estimation result of display condition of an organic electroluminescent display panel are shown in FIG. 3. A good result was obtained in example in comparison with comparative example.

What is claimed is:

1. A manufacturing method of an organic electroluminescent element including pixel electrodes, cathode(s) and an organic luminescent medium layer including an organic luminescent layer and a hole transport layer, the method comprising:
    forming an insulator layer between pattern shaped pixel electrodes on a substrate, and
    forming a hole transport layer on the pixel electrodes between insulator layers by relief printing hole transport ink,
    wherein the hole transport ink on projection parts of a relief printing plate is printed on the substrate,
    wherein the hole transport ink consisting essentially of 3,4-polyethylen dihydroxy thiophen (PEDOT) solution, monohydric alcohol and dihydric alcohol,
    wherein a total of the weight fraction of the monohydric alcohol and the dihydric alcohol in the hole transport ink is 5%-50%,
    wherein the monohydric alcohol lowers surface tension of the hole transport ink and the dihydric alcohol retards drying of the hole transport ink and
    wherein a contact angle of the hole transport ink on the relief printing plate is 15-45 degrees.

2. The manufacturing method of an organic electroluminescent element according to claim 1, wherein boiling points of the monohydric alcohol and the dihydric alcohol are equal to or less than 200 degrees Celsius at atmospheric pressure.

3. The manufacturing method of an organic electroluminescent element according to claim 1,
    wherein the monohydric alcohol includes methanol, ethanol or isopropanol, and
    wherein the dihydric alcohol includes ethylene glycol or propylene glycol.

4. The manufacturing method of an organic electroluminescent element according to claim 1,
    wherein the pixel electrode is line-shaped, and
    wherein the hole transport layer is line-shaped and is formed on the pixel electrode.

* * * * *